US008130049B2

(12) United States Patent
Huang et al.

(10) Patent No.: US 8,130,049 B2
(45) Date of Patent: Mar. 6, 2012

(54) SUBMILLIMETER-WAVE SIGNAL GENERATION BY LINEAR SUPERIMPOSITION OF PHASE-SHIFTED FUNDAMENTAL TONE SIGNALS

(75) Inventors: Daquan Huang, Allen, TX (US); Mau-Chung Frank Chang, Los Angeles, CA (US); Tim R. LaRocca, Redondo Beach, CA (US)

(73) Assignee: The Regents of the University of California, Oakland, CA (US)

( * ) Notice: Subject to any disclaimer, the term of this patent is extended or adjusted under 35 U.S.C. 154(b) by 134 days.

(21) Appl. No.: 12/579,661

(22) Filed: Oct. 15, 2009

(65) Prior Publication Data

US 2010/0109724 A1    May 6, 2010

Related U.S. Application Data

(63) Continuation of application No. PCT/US2008/060025, filed on Apr. 11, 2008.

(60) Provisional application No. 60/912,155, filed on Apr. 16, 2007.

(51) Int. Cl.
*H03B 5/12* (2006.01)

(52) U.S. Cl. .. 331/117 FE; 331/45; 331/46; 331/117 R; 331/135; 332/149

(58) Field of Classification Search .................. 331/45, 331/46, 117 R, 117 FE, 135, 167; 327/51, 327/52, 65, 359; 332/149
See application file for complete search history.

(56) References Cited

U.S. PATENT DOCUMENTS

| 4,612,533 | A | 9/1986 | Evans |
| 5,401,953 | A | 3/1995 | Spencer et al. |
| 5,414,741 | A | 5/1995 | Johnson |
| 6,016,080 | A | 1/2000 | Zuta et al. |
| 6,066,997 | A | 5/2000 | Matsugatani et al. |
| 6,970,048 | B1 * | 11/2005 | Devnath et al. ................. 331/46 |
| 7,016,662 | B1 | 3/2006 | Manku et al. |
| 2003/0010998 | A1 | 1/2003 | Callaway, Jr. |
| 2006/0181356 | A1 * | 8/2006 | Park et al. ....................... 331/45 |
| 2006/0228118 | A1 | 10/2006 | Schemmann et al. |
| 2007/0057740 | A1 * | 3/2007 | Ryu et al. ........................ 331/45 |

* cited by examiner

*Primary Examiner* — Joseph Chang
*Assistant Examiner* — Jeffrey Shin
(74) *Attorney, Agent, or Firm* — John P. O'Banion

(57) ABSTRACT

Generation of Terahertz range (300 GHz to 3 THz) frequencies is increasingly important for communication, imaging and spectroscopic systems, including concealed object detection. Apparatus and methods describe generating multiple phase signals which are phase-locked at a fundamental frequency, which are then interleaved into an output which is a multiple of the fundamental frequency. By way of example phase generators comprise cross-coupling transistors (e.g., NMOS) and twist coupling transistors (NMOS) for generating a desired number of phase-locked output phases. A rectifying interleaver comprising a transconductance stage and Class B amplifiers provides superimposition of the phases into an output signal. The invention allows frequency output to exceed the maximum frequency of oscillation of a given device technology, such as CMOS in which a 324 GHz VCO in 90 nm digital CMOS with 4 GHz tuning was realized.

19 Claims, 6 Drawing Sheets

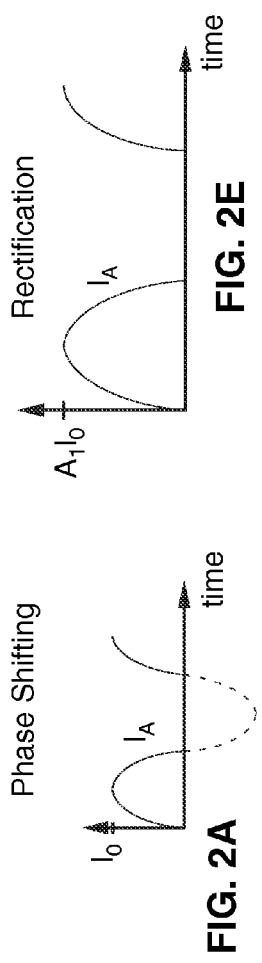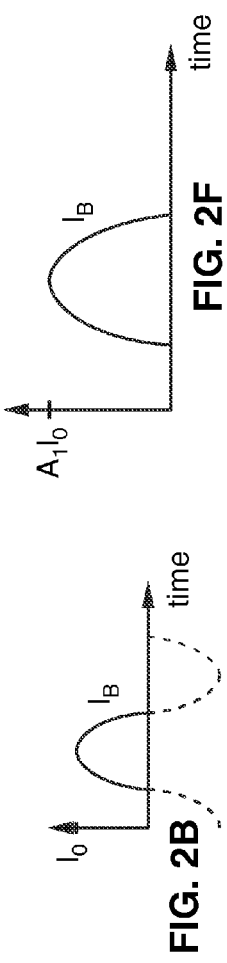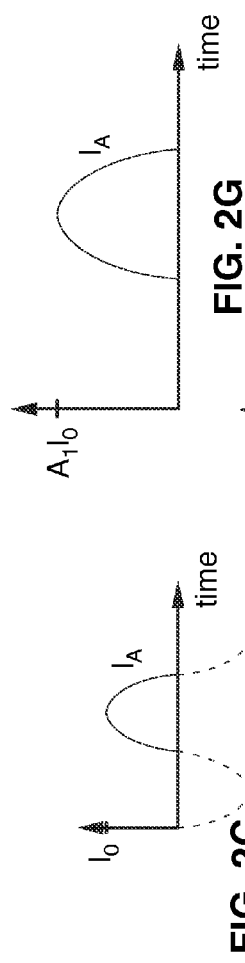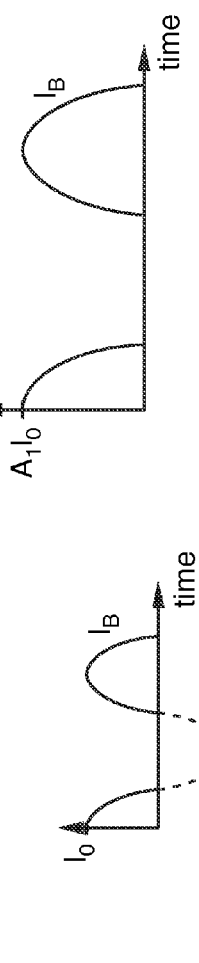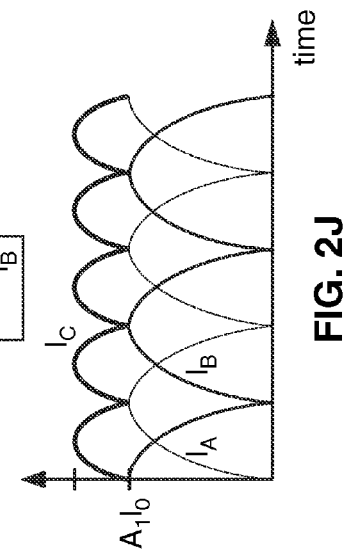

SUBMILLIMETER-WAVE SIGNAL GENERATION BY LINEAR SUPERIMPOSITION OF PHASE-SHIFTED FUNDAMENTAL TONE SIGNALS

CROSS-REFERENCE TO RELATED APPLICATIONS

This application claims priority to, and is a 35 U.S.C. §111(a) continuation of, co-pending PCT international application serial number PCT/US2008/060025, filed on Apr. 11, 2008, incorporated herein by reference in its entirety, which claims priority from U.S. provisional application Ser. No. 60/912,155 filed on Apr. 16, 2007, incorporated herein by reference in its entirety.

This application is also related to PCT International Publication No. WO 2009/009183 published on Jan. 15, 2009, incorporated herein by reference in its entirety.

STATEMENT REGARDING FEDERALLY SPONSORED RESEARCH OR DEVELOPMENT

This invention was made with Government support under Navy Award No. N66001-04-1-8934. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to voltage controlled oscillators (VCOs), and more particularly to submillimeter wave VCOs.

2. Description of Related Art

Voltage controlled oscillators (VCOs) are key components in a variety of sensor, imaging and communication applications. Much ongoing interest has been focused on the submillimeter wave regime and the ability to generate controllable frequencies toward the Terahertz range (300 GHz to 3 THz), such as for implementing communication systems as well as high resolution sensors and imaging devices. Moving toward shorter submillimeter wavelengths of course increases communication bandwidth. In addition, the submillimeter wave regime can provide a host of sensor and imaging devices which are capable of seeing through materials such as fog and clothing, and can provide a means of readily detecting concealed objects.

Currently, practical (e.g., low cost and/or readily implemented) submillimeter wave approaches extend up to about 190 GHz, above which gain losses, efficiency losses, and increased phase noise renders them unsuitable for practical applications. These current practical approaches are unable to reach beyond the 190 GHz range and into those portions of the spectrum within which less signal attenuation is encountered.

In addition, attempts toward reaching the submillimeter wave regime have typically required the use of exotic materials and processes which are incompatible with integrated circuit fabrication. However, operation at submillimeter wavelengths is currently not attainable with low cost practical circuits, but requires the use of exotic material and techniques, for example free-electron radiation, optical lasers, Gunn diodes or fundamental oscillation by using III-V based HBT/HEMT technology.

Therefore, a need exists for methods and apparatus for fabricating practical submillimeter wave VCOs which reach beyond 190 GHz with sufficient gain and efficiency and while minimizing phase noise. The present invention addresses that need and overcomes shortcomings of existing approaches.

BRIEF SUMMARY OF THE INVENTION

Apparatus and methods are described for fabricating submillimeter wave oscillators and in particular VCOs whose output can extend beyond 190 GHz. Apparatus have been demonstrated to 324 GHz while relying on conventional complementary metal-oxide semiconductor (CMOS) device technology, and the method is applicable to circuits capable of reaching approximately 600 GHz, and perhaps beyond.

Terahertz range (frequencies ranged from 300 GHz to 3 THz) imaging and spectroscopic systems have drawn increasing attention recently due to their unique capabilities in detecting and possibly analyzing concealed objects. The generation of terahertz signals is not readily achieved utilizing traditionally mechanisms, wherein approaches such as free-electron radiation, optical lasers, Gunn diodes or fundamental oscillation by using III-V based HBT/HEMT technology. By contrast to these 'exotic' solutions, the present invention substantially extends the operation range of deep-scaled CMOS by using a linear superimposition method, in which a 324 GHz VCO has been realized in 90 nm digital general purpose CMOS providing a 4 GHz tuning range and a supply voltage under 1 V. Ultra-high data rate wireless communications beyond that of IEEE 802.15.3c can be achieved with the approach wherein data rates comparable to that of fiber optical communications, such as OC768 (40 Gbps) and beyond, can be reached.

One implementation of the apparatus utilizes a standard 90 nm complementary metal-oxide semiconductor (CMOS) process to fabricate a device capable of a 324 GHz output frequency. The new apparatus and method is readily implemented and can be integrated with existing devices, such as toward creating high-resolution sensors, imagers, and communication systems.

The inventive method utilizes a linear superposition methodology in combination with analog signal processing. A CMOS VCO oscillator is fabricated for operation at a fundamental frequency (e.g., about 81 GHz) and is configured with phase-shifted outputs ($2\pi/N$ where N is an integer >1), such as at 0°, 90°, 180° and 270° for one quadrature embodiment of the invention. These phase signals (intermediates) are then linearly superimposed, to generate a waveform having a resultant oscillation frequency four times the fundamental frequency, or in this case 324 GHz. The method of the present invention has been shown to provide a high DC-to-RF conversion efficiency while being subject to low levels of phase noise. In another example, a device can be fabricated which uses quadruple 85-GHz VCO outputs to produce an output frequency of 340 GHz.

The methods of the invention can be implemented in designing highly integrated signal generators that can produce signals at frequencies up on the order of 600 GHz while consuming little power and circuit real-estate (e.g., small device 'footprint'). The apparatus described herein is configured to generate four (4) intermediaries (quadrature) while the method can be implemented using any desired number of contributions, such as in particular interleaving eight (8) or sixteen (16) different phase-shifted outputs.

An embodiment of the invention is described which substantially extends the operational range of deep-scaled CMOS by using a linear superimposition method, in which a 324 GHz VCO is realized in 90 nm digital CMOS with a 4 GHz tuning range when operating under a 1 V supply voltage.

The present method and apparatus may also open a convenient path for implementing ultra-high data rate wireless communications beyond that of IEEE 802.15.3c toward reaching data rates comparable to that of fiber optical communications, such as OC768 (40 Gbps) and beyond.

Numerous additional benefits arise from the use of frequencies in the 340 GHz range and above as they are less subject to free air and atmospheric attenuation. It will be appreciated that the use of longer millimeter-range waves excites atomic and molecular bonds while the smaller wavelengths "sneak through" and thus can propagate long distances.

Additional benefits arise in applications of submillimeter wavelength imaging, because imaging can be performed through clothing and other materials, such as generating an image from which it can be determined if an individual is carrying certain items, such as explosives, hidden beneath their clothing.

The invention is amenable to being embodied in a number of ways, including but not limited to the following descriptions.

One embodiment of the invention is an apparatus for generating submillimeter waves through voltage controlled oscillation (VCO), comprising: (a) at least two phase generators (N) of a VCO having a fundamental oscillation frequency of $\omega_0$, within which each phase generator outputs a phase-shifted signal $2\pi/N$, where integer value N>1, at the fundamental frequency ($\omega_0$); and (b) a linear superimposition stage configured for rectifying the outputs from each the phase generator and interleaving the outputs to produce a superimposed output signal at a frequency of $N\omega_0$.

It should be appreciated that the apparatus provides a number of advantages over conventional VCO techniques. The maximum output frequency which can be generated by the apparatus ($N\omega_0$) is not bounded by the maximum oscillation frequency ($\omega_0=2\pi f_{max}$) of the particular device technology relied upon for the oscillator device. The number of phase generators N is an integer preferably in the range of from 4 to 32, although it may be extended to any desired integer value. The apparatus is configured to phase-lock the output frequency ($N\omega_0$) in response to phase-locking of the fundamental frequency $\omega_0$ in the phase generators, which results in faster settling times and broader locking ranges. Fundamental, $2^{nd}$ and $3^{rd}$ harmonics within the apparatus are self-canceling which increases signal conversion efficiency. Fundamental-to-4th harmonic signal conversion efficiencies are provided which exceed approximately 15%. A wide tuning range is provided of over approximately 1% of the output frequency, which can be further extended. The superimposed linear phases have equivalent phase noise of the fundamental frequency $\omega_0$, and thus the output frequency contains less phase noise than that generated by nonlinear harmonic techniques. The apparatus is configured for use in many different applications, such as integration within submillimeter sensing, spectroscopic sensing, imaging, and communications devices.

In at least one implementation, the apparatus is implemented in CMOS technology and fabrication processes, such as providing an output frequency which exceeds 190 GHz utilizing a conventional 90 nm CMOS process, wherein a quadrature configuration resulted in a 324 GHz output and with maximum output frequencies in the Terahertz range, such as for example on the order of 600 GHz.

In at least one implementation, the phase generators comprise cross-coupling transistors (e.g., NMOS) and twist-coupling transistors (e.g., NMOS) connected to each cross-coupling transistor.

In at least one implementation, the linear superimposition stage comprises a transconductance circuit having a common output load impedance. By way of example, the linear superimposition stage may comprise Class-B power amplifiers which each generate half-cycle sinusoidal current pulses, and whose outputs are coupled together on a harmonic load.

In at least one implementation, phase contributions from multiple VCOs are coupled to one another with twisted coupling topology to lock the phase relationships while achieving high power levels at the interleaver.

One embodiment of the invention is an apparatus for generating submillimeter waves through voltage controlled oscillation (VCO), comprising: (a) at least two phase generators (N) of a VCO having a fundamental oscillation frequency of $\omega_0$, wherein each phase generator outputs a phase-shifted signal $2\pi/N$, where integer value N>1, at the fundamental frequency ($\omega_0$), and where the maximum output frequency that can be generated by the apparatus ($N\omega_0$) is not bounded by the maximum oscillation frequency ($\omega_0=2\pi f_{max}$) of the particular device technology which constitutes the device; and (b) a linear superimposition stage configured for rectifying the outputs from each the phase generator and interleaving the outputs to produce a superimposed output signal at a frequency of $N\omega_0$, where the output frequency ($N\omega_0$) is phase locked in response to phase-locking of the fundamental frequency $\omega_0$ within the phase generators, and in which fundamental, $2^{nd}$ and $3^{rd}$ harmonics within the apparatus are self-canceling toward increasing signal conversion efficiency.

One embodiment of the invention is a method of generating submillimeter waves through voltage controlled oscillation (VCO), comprising: (a) generating multiple phases (N>1) of a fundamental oscillation frequency $\omega_0$, where N is an integer value; (b) rectifying the multiple phases into rectified phase outputs; and (c) interleaving the multiple rectified phase outputs into a superimposed output signal having a frequency of $N\omega_0$, where the output frequency ($N\omega_0$) is phase locked in response to phase-locking of the fundamental frequency $\omega_0$, and in which the output frequency ($N\omega_0$) is not bounded by the maximum oscillation frequency ($\omega_0=2\pi f_{max}$) of the device generating the fundamental frequency $\omega_0$.

The present invention provides a number of beneficial aspects which can be implemented either separately or in any desired combination without departing from the present teachings.

An aspect of the invention is a method and apparatus for generating submillimeter waves.

Another aspect of the invention is the ability to generate oscillator output whose frequency exceeds the maximum oscillation frequencies for the given integrated circuit technology.

Another aspect of the invention is the ability to generate oscillator output whose frequency exceeds 190 GHz utilizing a conventional 90 nm CMOS integrated circuit materials and fabrication techniques.

Another aspect of the invention is the ability to generate submillimeter oscillator output from a VCO implemented in CMOS.

Another aspect of the invention is the ability to generate oscillator output on the order of 600 GHz.

Another aspect of the invention is a VCO apparatus having low phase noise contribution.

Another aspect of the invention is an apparatus whose maximum output frequency range is not bounded by the maximum oscillation frequency of the particular device technology which constitutes the device.

Another aspect of the invention is a VCO apparatus in which multiple phases generated at a fundamental frequency, are rectified and superimposed (interleaved) into an output with an output frequency which is a multiple of the fundamental.

Another aspect of the invention is a VCO apparatus in which linear superimposition of multiple phase-shifted signals $2\pi/N$ (N>1) from a fundamental signal ($\omega_0$), which are rectified and interleaved to produce a superimposed output signal at the intended frequency of $N\omega_0$.

Another aspect of the invention is a VCO apparatus having phase generation stages comprising cross-coupling transistors (e.g., NMOS).

Another aspect of the invention is a VCO apparatus having phase generation stages in which a twist-coupling transistor (e.g., NMOS) is connected to each cross-coupling transistor (e.g., NMOS).

Another aspect of the invention is a VCO apparatus comprising phase generation stages and rectifying interleaver stages.

Another aspect of the invention is a VCO apparatus in which the interleaver stages include a transconductance circuit having a common output load impedance.

Another aspect of the invention is a VCO apparatus in which the interleaver comprises Class-B power amplifiers which each generate half-cycle sinusoidal current pulses to increase efficiency, and whose outputs are coupled together on a harmonic load.

Another aspect of the invention is a VCO apparatus having the advantage of higher signal conversion efficiency and output power in response to self-cancellation of the fundamental, $2^{nd}$ and $3^{rd}$ harmonics.

Another aspect of the invention is a VCO apparatus wherein the superimposed linear phases have equivalent phase noise of the fundamental tone, which is naturally lower than the phase noise associated with the harmonics used in nonlinear harmonic approaches.

Another aspect of the invention is a VCO apparatus having the advantage of simplified external filtering requirements, for the lower (<4) harmonics, thereby leading to more compact circuit designs and lower power consumption.

Another aspect of the invention is a VCO apparatus having the advantage of allowing the output frequency of $4\omega_0$ to be phase-locked at the fundamental frequency $\omega_0$ toward achieving faster settling time and broader locking range.

Another aspect of the invention is a VCO apparatus having the advantage of significantly higher conversion efficiencies than are available utilizing harmonic generation through nonlinear circuit characteristics.

Another aspect of the invention is a VCO apparatus with fundamental-to-4th harmonic signal conversion efficiencies greater than approximately 15% (e.g., measured at 17% or −15.4 dB).

Another aspect of the invention is a VCO apparatus having an advantageously wide tuning range, such as over approximately 1% of the output frequency (e.g., over 4 GHz for the 324 GHz output).

Another aspect of the invention is a VCO apparatus in which phase contributions from multiple VCOs (e.g., N=four VCOs) are coupled to one another with twisted coupling topology to double the number of phases (e.g., 2N=eight-phases) with high power level at the interleaver.

A still further aspect of the invention is to provide a device which can be utilized for submillimeter sensors, spectroscopy, imaging, communications, as well as other applications and combinations thereof.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIGS. 2A-2H and 2J are plots of superpositioning for the VCO of FIG. 1, showing phase shifting, rectification and linear superimposition within the generated output frequency.

DETAILED DESCRIPTION OF THE INVENTION

Referring more specifically to the drawings, for illustrative purposes the present invention is embodied in the apparatus generally shown in FIG. 1 through FIG. 6. It will be appreciated that the apparatus may vary as to configuration and as to details of the parts, and that the method may vary as to the specific steps and sequence, without departing from the basic concepts as disclosed herein.

1. Sub-Millimeter-Wave Signal Generation.

Conventional methods can not be utilized for implementing VCOs in 90 nm CMOS beyond their maximum frequency of oscillation $f_{max}$. The highest currently reported CMOS oscillation frequency is 192 GHz through a second-order push-push methodology. It will be appreciated that other integrated circuit technologies similar bound the maximum frequencies of VCOs created using them. The method according to the present invention, however, overcomes these limitations by a technique in which rectified fundamental tone signals with quadruple output phases are interleaved into an output to increase the output frequency. As a result, the superimposed or combined output signal has four times higher frequency than that of the original fundamental tone.

Figure 1:
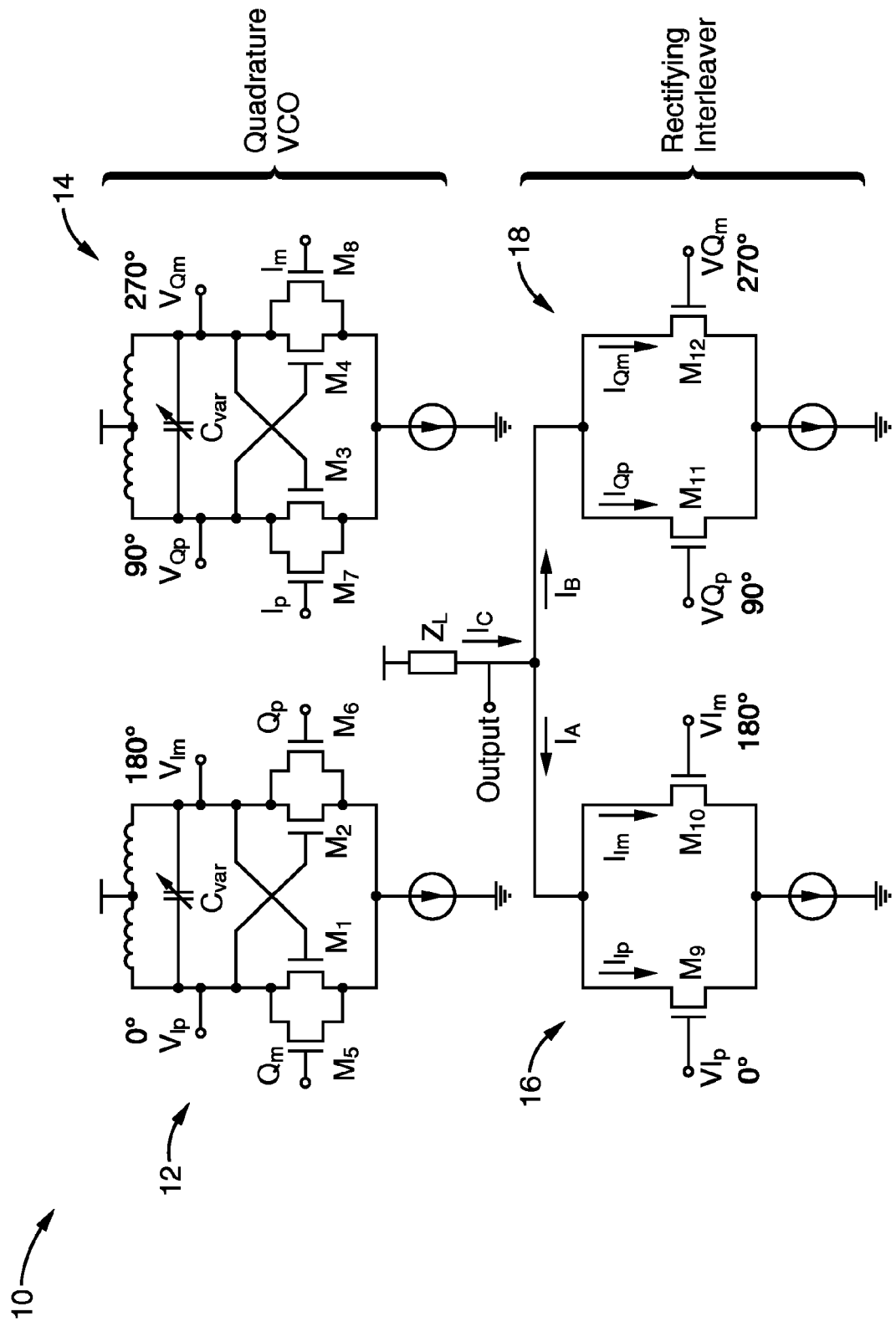
FIG. 1 is a schematic of a VCO for generating submillimeter wave frequencies according to an embodiment of the present invention, showing quadrature phase generation in combination with rectification and transconductance stages.

FIG. 1 illustrates an embodiment 10 of a signal generation circuit showing quadrature VCO circuits 12, 14 along with rectifying interleaver portions 16, 18. The quadrature VCO in this embodiment comprises two cross-coupled VCO cores 12, 14 generating quadrature phases of millimeter-wave fundamental signals $V_{Ip}$ (0°), $V_{Im}$ (180°), $V_{Qp}$ (90°) and $V_{Qm}$ (270°). These signal are then converted to corresponding output currents of $I_{Ip}$, $I_{Im}$, $I_{Qp}$ and $I_{Qm}$, respectively, via the transconductance stage 16, 18 (shown by way of example as class B amplifiers) which also rectifies the output current signals. The rectified currents are subsequently superimposed to deliver the output signal at the desired frequency of $4\omega_0$ via an inductive load of $Z_L$.

By way of example and not limitation, each VCO stage core comprises a cross-coupled NMOS pair ($M_1$ to $M_4$) such as having W/L=2.4 μm/90 nm and with a differential inductor load of L=0.3 nH. In this example the cores are twist-coupled by $M_5$ to $M_8$ with W/L=2 μm/90 nm to complete the quadrature VCO. Devices $M_9$ to $M_{12}$, such as with W/L=10 μm/90 nm, are used to form transconductance stages, such as providing a common output load of $Z_L$=0.2 nH, which rectifies input quadrature signals and produces the output signal at $4\omega_0$.

FIGS. 2A-2H and 2J illustrate superposition according to the present invention, which does not rely on device nonlinearities, but employs linear superimposition of multiple phase-shifted ($2\pi/N$ in sequence, where N is an integer greater than one) and rectified fundamental signals ($\omega_0$) to produce a superimposed output signal at the intended frequency of $N\omega_0$. This method is more readily comprehended graphically in FIGS. 2A-2H and 2J which is according to an example with N=4. Phase shifted signals of $I_{Ip}=I_0 \sin(\omega_0 t)$, $I_{Qp}=I_0 \sin(\omega_0 t+\pi/2)$, and $I_{Im}=I_0 \sin(\omega_0 t+\pi)$, $I_{Qm}=I_0 \sin(\omega_0 t+3\pi/2)$ are generated by a quadrature VCO as shown in the phase shifted signals of FIG. 2A-2D. These signals are then rectified as shown in rectification FIG. 2E-2H and linearly superimposed to produce the final output signal FIG. 2J of $$I_{output} = I_A + I_B \quad (1)$$
$$= I_0(|\sin(\omega_0 t)| + |\cos(\omega_0 t)|)$$
$$= \frac{4}{\pi} A_I I_0 \left(1 - \frac{2}{3.5} \cos(4\omega_0 t) + \ldots \right)$$

where $A_I$ is the rectification gain. As clearly indicated in Eq. 1, the superimposition has canceled the fundamental, $2^{nd}$ and $3^{rd}$ harmonics and leaves the $4^{th}$ order term with a fundamental-to-$4^{th}$ harmonic signal conversion efficiency of $$\eta_1 = \left(\frac{8}{15\pi} \cdot A_I I_0\right) / (I_0) = \frac{8}{15\pi} \cdot A_I \quad (2)$$

By setting $A_I \approx 1$, this results in $\eta_1$=17% or −15.4 dB, which is significantly higher than that of traditional harmonic generation or push-push approaches and achieves the equivalent frequency multiplication factor of four.

This new $4\omega_0$ frequency generation technique has a number of distinct advantages, including: (1) higher signal conversion efficiency and output power due to self-cancellation of the fundamental, $2^{nd}$ and $3^{rd}$ harmonics; (2) a simplified external filtering requirement to lower (<4) harmonics leading to more compact circuit design and lower power consumption; (3) the $4\omega_0$ output signal may be phase-locked by a PLL at the fundamental frequency $\omega_0$ for achieving faster settling time and broader locking range.

FIG. 2J illustrates an output waveform $I_C$, wherein it can be appreciated that the combined output waveform can be simply derived as $I_C = I_A + I_B = |\cos(\omega_0 t)| + |\sin(\omega_0 t)|$.

Accordingly, the output signal (e.g., $4\omega_0$, $6\omega_0$, $8\omega_0$, $16\omega_0$, and so forth) is linearly generated by superimposing rectified fundamental signals with interleaved multiple output phases, and provides conversion efficiency which is significantly higher than that provided by harmonic generation through nonlinear circuit characteristics. For the same reason, the phase noise of the proposed superimposed output is equivalent to that of the fundamental tone which is naturally lower than that of harmonics. This multi-phase frequency superimposition topology can be easily extended to generate even higher frequencies from rectified foundational tones. For example, $6\omega_0$ and $8\omega_0$ signals can be generated by superimposing six (6) and eight (8) phases of fundamental tones, respectively. The generated sub-millimeter-wave signal can be phase-locked if the condition is met that its fundamental signal components are locked through a phase locked loop (PLL).

Figure 3:
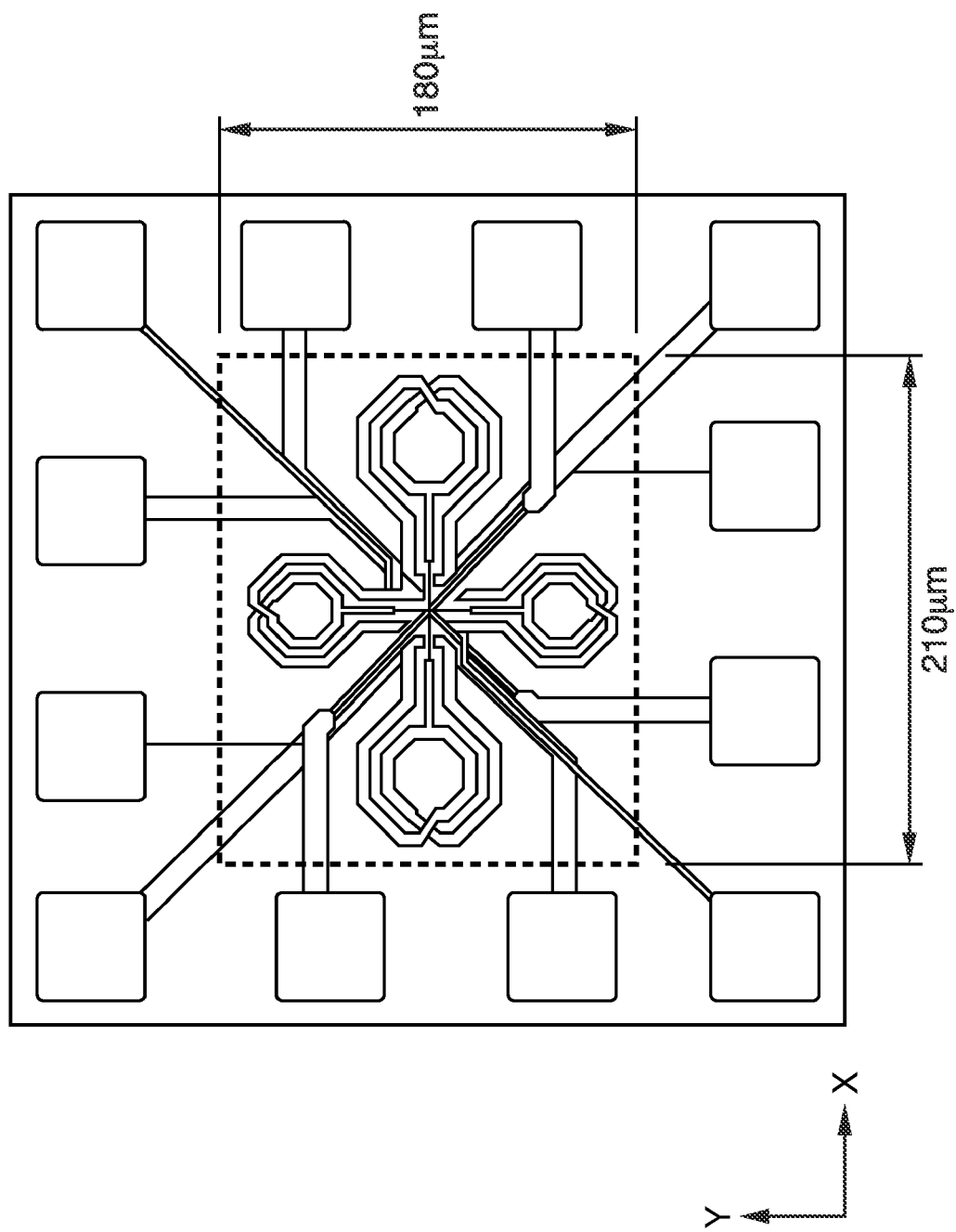
FIG. 3 is a plan view of the submillimeter wave superposition signal generator according to an aspect of the present invention, wherein the drawing is a rendering of a fabricated circuit die.

FIG. 3 is a rendition of a 324 GHz VCO integrated circuit chip fabricated according to the present invention, and shown having a very small active device area of 180×210 μm. The embodiment shown was fabricated in a digital (i.e., general purpose) deep-scaled 90 nm CMOS, for example according to a process referred to as GP 90N from TSMC®. It should be appreciated, however, that the method and apparatus of the present invention may be implemented with various device technologies and processes without departing from the teachings of the present invention.

Figure 4:
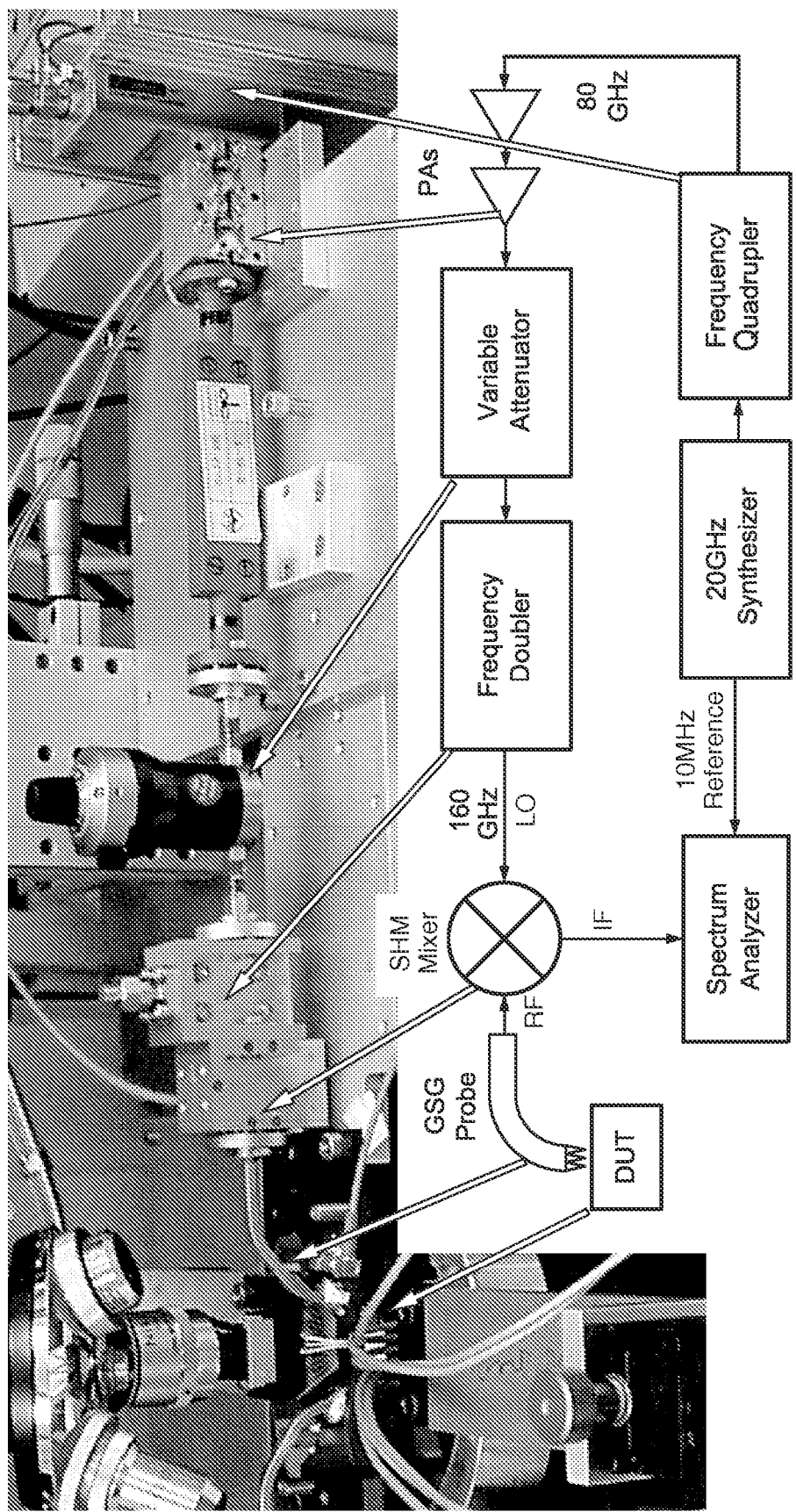
FIG. 4 is an image of a test setup for the circuit die of FIG. 3, with an inset depicting a block diagram for the test configuration.

FIG. 4 illustrates an embodiment of the apparatus fabricated in CMOS which has been demonstrated in the Jet Propulsion Laboratory (JPL) using an on-wafer VCO submillimeter-wave test set. It will be noted that FIG. 4 includes an inset showing the device under test (DUT) connected to a GSG probe connecting to a mixer whose other input is from a signal generation source (shown as Anritsu NV set coupled though quadrupler, amplifiers, variable attenuator, frequency doubler). The output from the mixer is registered on a spectrum analyzer. The following discusses the configuration in greater detail.

By providing a 166 GHz local oscillator signal to a WR2.8 subharmonic mixer, the VCO signal down-conversion through the mixer to 8.2 GHz were verified. Thus, the VCO frequency is $|(f_{VCO}-2*f_{LO})|=f_{IF}$, or $|f_{VCO}-2*(166 \text{ GHz})|$=8.2 GHz, yielding $f_{VCO}$=324 GHz, wherein $f_{VCO}$ is the VCO frequency, $f_{LO}$ is the local oscillator frequency presented to the subharmonic mixer, and $f_{IF}$ is the down-converted intermediate frequency observed on a spectrum analyzer. Separate verification that the fundamental oscillation frequency occurs at 81 GHz has been performed at University of California at Los Angeles (UCLA).

Returning to FIG. 4, the DUT output for this particular test setup is probed on-wafer using a custom-designed GSG WR3 waveguide probe with a cutoff frequency of 173 GHz, which ensures no signal will pass below the cutoff frequency into the mixer. The oscillator signal is fed into a sub-harmonic mixer (SHM) pumped with an LO signal of 160 GHz. The LO signal is generated from a synthesizer set at 20 GHz followed by a frequency quadrupler and doubler. Two W-Band PA modules and one variable attenuator are inserted between the quadrupler and doubler to boost the 80 GHz tone while suppressing high-order harmonics. Under various bias conditions ($V_{DD}$=1~1.2V, $I_{DC}$=12~16 mA), the output frequencies of more than ten VCOs vary between 319 GHz to 325 GHz.

Figure 5:
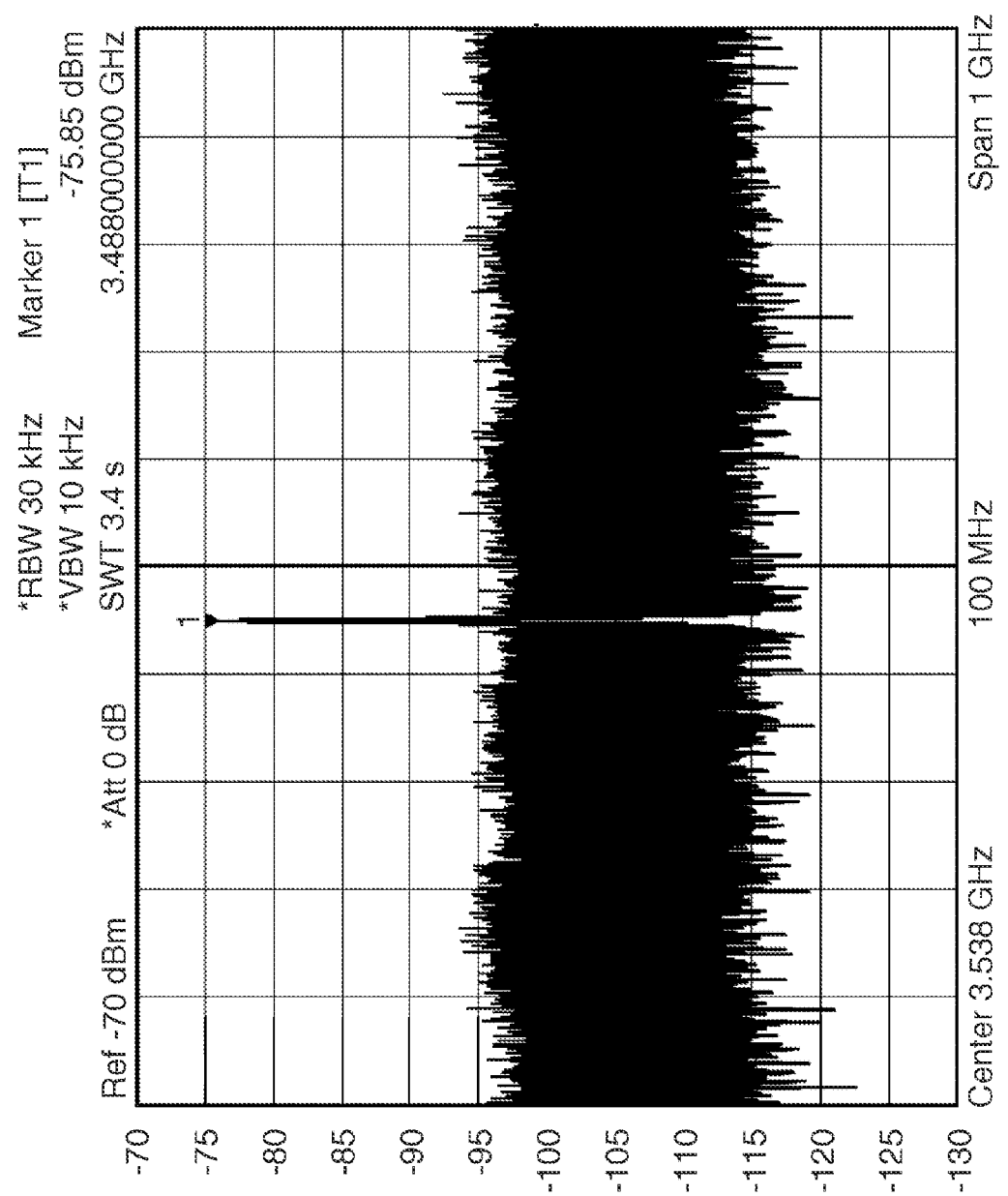
FIG. 5 is a graph of the measured output signal for the device of FIG. 3 within the test setup of FIG. 4, showing the output at 324 GHz.

FIG. 5 illustrates representative test data for output frequency and power. It was determined that the measured output power with a 50Ω load is about −76 dBm before calibration. With the test setup loss of about 30 dB, the calibrated output power at 324 GHz is estimated at about −46 dBm. Additionally, a −26 dBm output power at 81 GHz is measured from a separate fundamental-signal-only VCO on the same wafer. Considering the 15.4 dB signal conversion loss given by $\eta_1$ of Eq. 2, this yields $4\omega_0$ output power of −41.4 dBm at 324 GHz. The minor output power discrepancy from two methods, −46 dBm versus −41.4 dBm, may be partially caused by variations of loss between different test setups and equipment.

Figure 6:
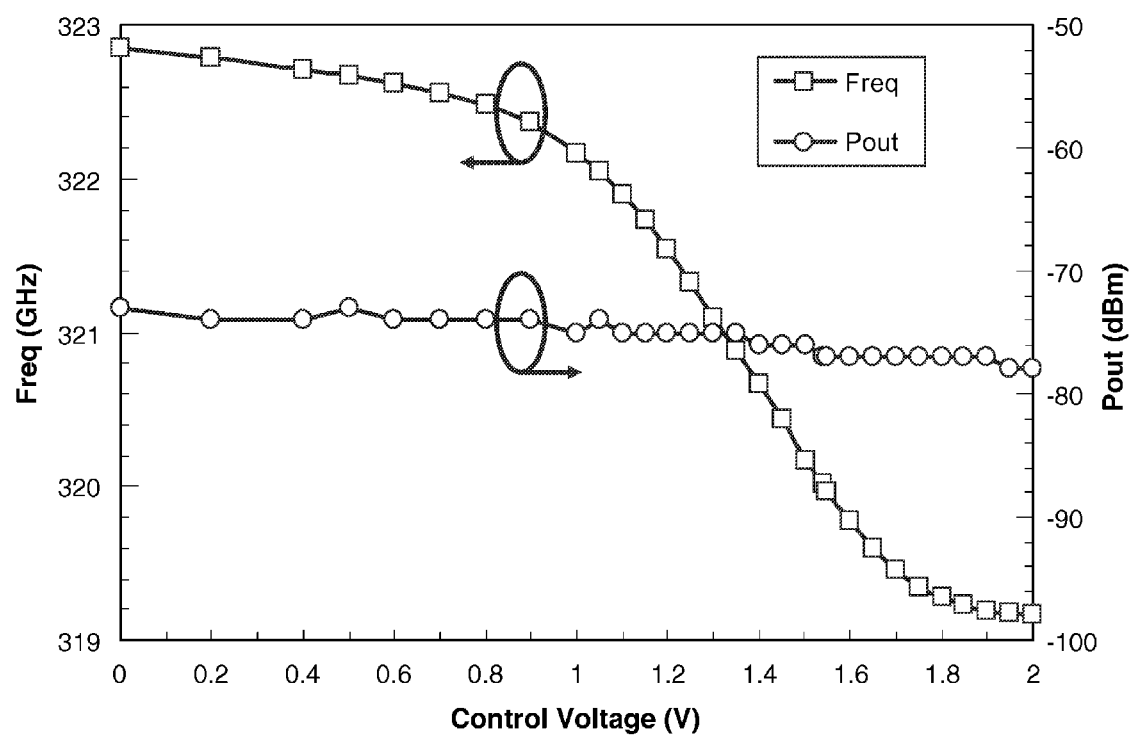
FIG. 6 is a graph of VCO tuning range according to an aspect of the present invention, showing the varied frequency with respect to control voltage and the relative output power stability.

FIG. 6 illustrates a measured VCO tuning range of 4 GHz by varying the control voltage between 0~2V across the varactor of $C_{var}$. The rejection of lower-order harmonics is also confirmed by measuring the fundamental tone at the output node. No fundamental tone is observed above the −80 dBm noise floor. The high fundamental tone rejection at the output node (>39 dB) is attributed to the linear superimposition algorithm and the designated inductive loading at $4\omega_0$. The $2^{nd}$ and $3^{rd}$ harmonics are beyond the range of the 110 GHz spectrum analyzer utilized in the present test setup but are expected to provide even lower output power than that of the fundamental tone. Due to the lack of equipment capable of measuring the phase noise directly at 324 GHz, its phase noise level of −78 dBc/Hz was estimated at a 1 MHz frequency offset by adding −20 Log(4)dB (i.e., −12 dB) to the measured phase noise of −90 dBc/Hz of the fundamental signal from a separate fundamental-signal-only VCO.

2. Sub-Millimeter-Wave Output Power Combining.

To increase the output power level, it will be appreciated that both high power VCOs and power amplification circuits are necessary. In one embodiment of the VCO design, instead of designing a quadrature VCO, one can design multiple VCOs (e.g., N=four VCOs) with twisted coupling topology providing the twice that multiple of phases (e.g., 2N=eight-phases). These eight-phases can be grouped into two subgroups, each with four (4) quadrature phases, i.e., (0°, 180°, 90°, 270°) and (45°, 225°, 135°, 315°), and separately fed through class B amplifiers to create the superimposed, rectified output signal. This arrangement yields a differential output signal having a frequency which is four (4) times as high as the fundamental frequency and thus increases the output power by 3 dB, while in addition, these four (4) reciprocally coupled VCOs reduce the overall phase noise by 3 dB (2 ln 2).

In practice, a standard Class-B power amplifier is a reduced conduction angle (π) amplifier that generates half-cycle sinusoidal current pulses to increase efficiency. By shorting the outputs of a differential class-B power amplifier to a common load superimposes the half-cycle current pulses to create an output current waveform $i_{out}=|\cos(\omega t)|$. The power amplifier operates on the fundamental tone of the VCO to generate high level current waveforms. Thus, a high power sit-millimeter wave signal is generated by superimposing the four (4) quadrature phases from the VCOs through two differential class-B amplifiers with the outputs shorted to an optimized $4^{th}$ harmonic load. Once again the fundamental tones are amplified, however, only by multiples of the $4\omega_0$ which are generated via the superposition of the rectified four (4) quadrature waveforms. According to the invention, a 60 GHz power amplifier has been fabricated in 0.13 μm CMOS with a measured power gain of 8 dB and a $P_{1db}$, of 8 dBm. An improved version of the power amplifier has been implemented in 90 nm CMOS toward improving gain and $P_{1db}$. By way of example, the output interface with the test bed or other components can be provided in any desired manner, such as through a 1:n transformer to maintain high-impedance loading.

3. Conclusion.

In conclusion, a linear superimposition technique is devised to generate terahertz (324 GHz) output signals of −46 dBm in 90 nm CMOS with a fundamental-signal-to-4th harmonic signal conversion efficiency of 17% or −15.4 dB. The associated phase noise is estimated as −78 dBc/Hz and −91 dBc/Hz at 1 MHz and 10 MHz offset, respectively. The fundamental tone is rejected at the output node by at least 39 dB without additional filtering. The circuit draws 12 mA from 1V supply and occupies a core area of □210×180 μm. The frequency tuning range is measured as 4 GHz with output power variation less than 5 dB.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

324 GHz CMOS VCO Performance Summary

| Functions | Performance |
| --- | --- |
| Output Frequency | 324 GHZ |
| Frequency Multiplication Factor | 4× |
| Calibrated Output Power | −46 dBm |
| Maximum Fundamental-to-$4^{th}$ Harmonic signal Conversion Efficiency | 17% or −15.4 dB |

TABLE 1-continued

324 GHz CMOS VCO Performance Summary

| Functions | Performance |
|---|---|
| Measured Rejection of Fundamental signal | >39 dB |
| Tuning Range | 4 GHz |
| Estimated Phase Noise based on | −78 dBc/Hz at 1 MHz offset |
| Measured Phase Noise at Fundamental | −86 dBc/Hz at 5 MHz offset |
|  | −91 dBc/Hz at 10 MHz offset |
| Supply Voltage | 1 V |
| Current Consumption | 12 mA |
| Chip Core Area | 210 × 180 μm |

What is claimed is:

1. An apparatus for generating submillimeter waves through voltage controlled oscillation (VCO), comprising:
   at least two phase generators (N) of a VCO having a fundamental oscillation frequency of $\omega_0$ and producing outputs;
   wherein said phase generators include at least one twist-coupled transistor on each of said phase generators;
   wherein each said phase generator produces a phase-shifted signal $2\pi/N$ as an output, where integer value N>1, at said fundamental frequency ($\omega_0$); and
   a linear superimposition stage configured for rectifying the output from each said phase generator and interleaving each of said outputs to produce a superimposed output signal at a frequency of $N\omega_0$.

2. An apparatus as recited in claim 1, wherein the maximum output frequency which can be generated by said apparatus ($N\omega_0$) is not bounded by the maximum oscillation frequency ($\omega_0 = 2\pi f_{max}$) of the particular device technology which constitutes the device.

3. An apparatus as recited in claim 1, wherein said apparatus is configured to phase-lock the output frequency ($N\omega_0$) in response to phase-locking of the fundamental frequency $\omega_0$ in the phase generators, which results in faster settling times and broader locking ranges.

4. An apparatus as recited in claim 1:
   wherein said apparatus is implemented in CMOS technology and fabrication processes; and
   wherein the output frequency of said apparatus is configured to exceed 190 GHz utilizing a conventional 90 nm CMOS with maximum output frequencies in the Terahertz range.

5. An apparatus as recited in claim 1, wherein said apparatus implemented in CMOS is configured to generate oscillator output up to on the order of 600 GHz.

6. An apparatus as recited in claim 1, wherein said phase generators comprise cross-coupling transistors.

7. An apparatus as recited in claim 6, wherein said cross-coupling transistors comprise NMOS transistors.

8. An apparatus as recited in claim 1, wherein said cross-coupling transistors comprise NMOS transistors.

9. An apparatus as recited in claim 1, wherein said linear superimposition stage comprises a transconductance circuit having a common output load impedance.

10. An apparatus as recited in claim 1, wherein said linear superimposition stage comprises Class-B power amplifiers which each generate half-cycle sinusoidal current pulses, and whose outputs are coupled together on a harmonic load.

11. An apparatus as recited in claim 1, wherein fundamental, $2^{nd}$ and $3^{rd}$ harmonics within said apparatus are self-canceling which increases signal conversion efficiency.

12. An apparatus as recited in claim 1, wherein said apparatus provides fundamental-to-4th harmonic signal conversion efficiencies greater than approximately 15%.

13. An apparatus as recited in claim 1, wherein said apparatus has a wide tuning range of over approximately 1% of the output frequency.

14. An apparatus as recited in claim 1:
   wherein the superimposed linear phases have equivalent phase noise of the fundamental frequency $\omega_0$; and
   wherein said apparatus generates said output frequency with less phase noise than that generated by nonlinear harmonic techniques.

15. An apparatus as recited in claim 1, wherein the number of phase generators N is an integer in the range of from 4 to 32.

16. An apparatus as recited in claim 1, wherein phase contributions from multiple VCOs are coupled to one another with twisted coupling topology to provided twice that multiple of phases with high power level at the interleaver.

17. An apparatus as recited in claim 1, wherein said apparatus is configured for integration within submillimeter sensing, spectroscopy, imaging, and communications devices.

18. An apparatus for generating submillimeter waves through voltage controlled oscillation (VCO), comprising:
   at least two phase generators (N) of a VCO having a fundamental oscillation frequency of $\omega_0$;
   wherein each said phase generator outputs a phase-shifted signal $2\pi/N$, where integer value N>1, at said fundamental frequency ($\omega_0$);
   wherein said phase generators include at least one twist-coupled transistor on each of said phase generators;
   wherein the maximum output frequency which can be generated by said apparatus ($N\omega_0$) is not bounded by the maximum oscillation frequency ($\omega_0 = 2\pi f_{max}$) of the particular device technology which constitutes the device; and
   a linear superimposition stage configured for rectifying the outputs from each said phase generator and interleaving said outputs to produce a superimposed output signal at a frequency of $N\omega_0$;
   wherein said output frequency ($N\omega_0$) is phase locked in response to phase-locking of said fundamental frequency $\omega_0$ within said phase generators; and
   wherein fundamental, $2^{nd}$ and $3^{rd}$ harmonics within said apparatus are self-canceling which increases signal conversion efficiency.

19. A method of generating submillimeter waves through voltage controlled oscillation (VCO), comprising:
   generating multiple phases (N>1) of a fundamental oscillation frequency $\omega_0$, where N is an integer value;
   performing twist-coupling of transistors within phase generators configured for generating said multiple phases;
   rectifying said multiple phases into rectified phase outputs; and
   interleaving the multiple rectified phase outputs into a superimposed output signal having a frequency of $N\omega_0$;
   wherein said output frequency ($N\omega_0$) is phase locked in response to phase-locking of said fundamental frequency $\omega_0$; and
   wherein said output frequency ($\omega_0$) is not bounded by the maximum oscillation frequency ($\omega_0 = 2\pi f_{max}$) of the device generating said fundamental frequency $\omega_0$.

* * * * *